US010657014B2

(12) United States Patent
Baty et al.

(10) Patent No.: US 10,657,014 B2
(45) Date of Patent: May 19, 2020

(54) METHODS FOR MONITORING AND MANAGING MEMORY DEVICES

(71) Applicant: Everspin Technologies, Inc., Chandler, AZ (US)

(72) Inventors: Kurt Baty, Austin, TX (US); Terry Van Hulett, Austin, TX (US)

(73) Assignee: Everspin Technologies, Inc., Chandler, AZ (US)

( * ) Notice: Subject to any disclaimer, the term of this patent is extended or adjusted under 35 U.S.C. 154(b) by 190 days.

(21) Appl. No.: 15/901,330

(22) Filed: Feb. 21, 2018

(65) Prior Publication Data

US 2018/0246794 A1 Aug. 30, 2018

Related U.S. Application Data

(60) Provisional application No. 62/464,211, filed on Feb. 27, 2017.

(51) Int. Cl.

| G06F 11/00 | (2006.01) |
|---|---|
| G06F 11/20 | (2006.01) |
| G06F 11/10 | (2006.01) |
| G11C 29/00 | (2006.01) |
| G11C 29/44 | (2006.01) |
| G06F 11/07 | (2006.01) |
| G06F 11/30 | (2006.01) |

(52) U.S. Cl.
CPC ........ *G06F 11/2094* (2013.01); *G06F 11/076* (2013.01); *G06F 11/0727* (2013.01); *G06F 11/106* (2013.01); *G06F 11/3037* (2013.01); *G11C 29/00* (2013.01); *G11C 29/4401* (2013.01); *G11C 29/76* (2013.01); *G06F 2201/805* (2013.01); *G06F 2201/82* (2013.01); *G06F 2201/85* (2013.01)

(58) Field of Classification Search
CPC .. G06F 11/0727; G06F 11/076; G06F 11/106; G06F 11/2094; G06F 11/3037; G11C 29/00; G11C 29/4401; G11C 29/76
See application file for complete search history.

(56) References Cited

U.S. PATENT DOCUMENTS

| 4,380,067 A | * | 4/1983 | Beardsley | ............... G06F 11/20 714/4.1 |
| 4,479,214 A | * | 10/1984 | Ryan | ....................... G06F 11/10 714/702 |
| 5,087,992 A | * | 2/1992 | Dahandeh | .............. G11B 5/012 360/31 |

(Continued)

*Primary Examiner* — Joshua P Lottich

(74) *Attorney, Agent, or Firm* — Bookoff McAndrews, PLLC

(57) ABSTRACT

The present disclosure is drawn to, among other things, a method of managing a memory device. In some aspects, the method includes scanning a first memory region for bit errors; in response to detecting one or more bit errors in the first memory region, incrementing a counter associated with the first memory region based on the number of bit errors detected; comparing a total number of bit errors against a threshold, wherein the total number of bit errors is identified from the first counter; and, if the total number of bit errors exceeds the threshold, restricting access to the first memory region by mapping an address corresponding to the first memory region to a second memory region.

19 Claims, 5 Drawing Sheets

(56) References Cited

U.S. PATENT DOCUMENTS

| | | | | |
|---|---|---|---|---|
| 5,233,614 A | * | 8/1993 | Singh | G06F 11/1044 714/702 |
| 2015/0186198 A1 | * | 7/2015 | Dong | G06F 11/076 714/706 |
| 2015/0278012 A1 | * | 10/2015 | Gjorup | G06F 11/076 714/704 |
| 2015/0339188 A1 | * | 11/2015 | Hu | G06F 11/1072 714/704 |
| 2015/0349806 A1 | * | 12/2015 | Totolos, Jr. | H03M 13/353 714/704 |
| 2015/0378801 A1 | * | 12/2015 | Navon | G06F 11/076 714/704 |
| 2017/0116070 A1 | * | 4/2017 | Alrod | G11C 16/26 |
| 2017/0160934 A1 | * | 6/2017 | Park | G06F 3/061 |
| 2017/0262218 A1 | * | 9/2017 | Chiang | G06F 3/061 |
| 2017/0269979 A1 | * | 9/2017 | Gollub | G06F 11/076 |
| 2018/0188984 A1 | * | 7/2018 | Tai | G06F 12/0253 |

\* cited by examiner

METHODS FOR MONITORING AND MANAGING MEMORY DEVICES

CROSS-REFERENCE TO RELATED APPLICATIONS

This application claims the benefit of priority from U.S. Provisional Application No. 62/464,211, filed on Feb. 27, 2017, which is incorporated by reference herein in its entirety.

TECHNICAL FIELD

Embodiments of the present disclosure relate to, among other things, managing the health and/or extending or otherwise prolonging the lifespan of memory devices. More specifically, in one aspect, embodiments of the present disclosure relate to monitoring and leveraging error and/or access data for dynamically managing the health of memory devices.

INTRODUCTION

In general, a memory system may include a memory device for storing data and a host (or controller) for controlling operations of the memory device. Memory devices may be classified into, e.g., volatile memory (such as, e.g., DRAM or SRAM) and non-volatile memory (such as EEPROM, FRAM (Ferroelectric RAM), PRAM (Phase-change memory), MRAM (magnetoresistive memory), RRAM/ReRAM (resistive memory) and Flash memory). These memory devices may be made up of an array of cells, each of which stores bits of data programmed into the memory device. The cells may be individually addressable for reading and writing data from/to the cell. Each cell may have a finite lifetime in terms of the number of access (e.g., read, erase, write) cycles that it can undergo. Because of this limitation, the functionality of the memory device may become compromised or otherwise fail as cells reach the one or more limits (e.g., an upper limit) of their lifetimes.

BRIEF DESCRIPTION OF THE DRAWINGS

In the course of the detailed description that follows, reference will be made to the appended drawings. The drawings show different aspects of the present disclosure and, where appropriate, reference numerals illustrating like structures, components, materials, and/or elements in different figures are labeled similarly. It is understood that various combinations of the structures, components, and/or elements, other than those specifically shown, are contemplated and are within the scope of the present disclosure.

Moreover, there are many embodiments of the present disclosure described and illustrated herein. The present disclosure is neither limited to any single aspect nor embodiment thereof, nor to any combinations and/or permutations of such aspects and/or embodiments. Moreover, each of the aspects of the present disclosure, and/or embodiments thereof, may be employed alone or in combination with one or more of the other aspects of the present disclosure and/or embodiments thereof. For the sake of brevity, certain permutations and combinations are not discussed and/or illustrated separately herein; however, all permutations and combinations are considered to fall within the scope of the present inventions.

Figure 1A:
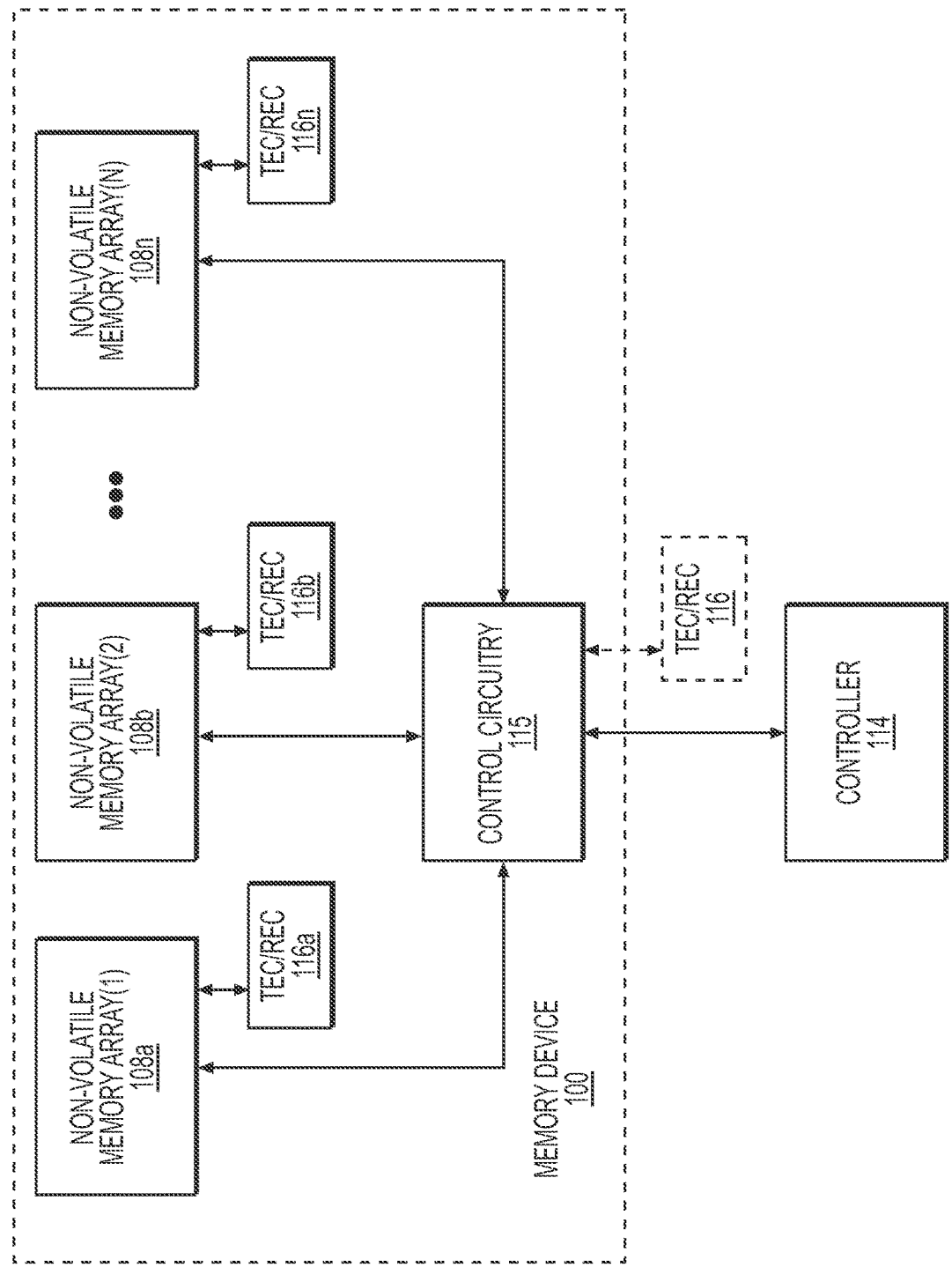
FIG. 1A depicts a block diagram of select components of a memory device having one or more non-volatile memory arrays, according to one aspect of the present disclosure.

Again, there are many embodiments described and illustrated herein. The present disclosure is neither limited to any single aspect nor embodiment thereof, nor to any combinations and/or permutations of such aspects and/or embodiments. Each of the aspects of the present disclosure, and/or embodiments thereof, may be employed alone or in combination with one or more of the other aspects of the present disclosure and/or embodiments thereof. For the sake of brevity, many of those combinations and permutations are not discussed separately herein.

As used herein, the terms "comprises," "comprising," or any other variation thereof, are intended to cover a non-exclusive inclusion, such that a process, method, article, or apparatus that comprises a list of elements does not include only those elements, but may include other elements not expressly listed or inherent to such process, method, article, or apparatus. The term "exemplary" is used in the sense of "example," rather than "ideal."

DETAILED DESCRIPTION

Detailed illustrative aspects are disclosed herein. However, specific structural and functional details disclosed herein are merely representative for purposes of describing example embodiments of the present disclosure. The present disclosure may be embodied in many alternate forms and should not be construed as limited to only the embodiments set forth herein. Further, the terminology used herein is for the purpose of describing particular embodiments only and is not intended to be limiting of exemplary embodiments described herein.

When the specification makes reference to "one embodiment" or to "an embodiment," it is intended to mean that a particular feature, structure, characteristic, or function described in connection with the embodiment being discussed is included in at least one contemplated embodiment of the present disclosure. Thus, the appearance of the phrases, "in one embodiment" or "in an embodiment," in different places in the specification does not constitute a plurality of references to a single embodiment of the present disclosure.

As used herein, the singular forms "a," "an," and "the" are intended to include the plural forms as well, unless the context clearly indicates otherwise. It also should be noted that in some alternative implementations, the features and/or steps described may occur out of the order depicted in the figures or discussed herein. For example, two steps or figures shown in succession may instead be executed substantially concurrently or may sometimes be executed in the reverse order, depending upon the functionality/acts involved. In some aspects, one or more described features or steps may be omitted altogether, or may be performed with an intermediate step therebetween, without departing from the scope of the embodiments described herein, depending upon the functionality/acts involved.

In one aspect, the present disclosure is directed to techniques and implementations to dynamically monitor and manage the health of memory devices, including, e.g., non-volatile or "permanent" memory capable of maintaining data when a power supply is deactivated (e.g., magnetic memories or magnetic random access memories or MRAMs). Though the description below makes reference to magnetoresistive memory devices (e.g., MRAM), the inventions may be implemented in conjunction with any RRAM/ReRAM now known or later developed, including, but not limited to, EEPROM, FRAM, PRAM, MRAM, RRAM/ReRAM and Flash memory.

With reference now to FIG. 1A, there is depicted an example block diagram of select components of a memory device 100, including non-volatile memory arrays 108a-108n. While three non-volatile memory arrays 108a, 108b, and 108n are shown, it should be understood that memory device 100 may include a greater or lesser number of non-volatile memory arrays. In some aspects, one or more of non-volatile memory arrays 108a-108n may include elements of magnetic memories or magnetic random access memories (MRAMs), such as magnetic memory cells or magnetic disk storage. Additionally, or alternatively, memory device 100 may include removable and/or non-removable media implemented in various types of technology for storage of information, such as, e.g., computer-readable instructions or modules, data structures, and/or program modules. Such computer-readable media may include, but is not limited to, RAM, ROM, EEPROM, flash memory or other computer-readable media technology, solid state storage, RAID (redundant array of independent disks) storage systems, storage arrays, network attached storage, storage area networks, cloud storage, or any other medium that may be used to store information.

In some embodiments, control circuitry 115 may be configured to receive various commands from controller 114 (e.g., a memory controller, processor, or the like). For example, control circuitry 115 may receive a read, write, or erase command from controller 114 to access and/or modify the data stored in one or more non-volatile memory arrays 108a-108n associated therewith. Notably, the memory arrays may be separately accessed discrete arrays or subsets of one or more larger arrays.

In addition, controller 114 and/or control circuitry 115 may be disposed on/in the same die as the memory arrays (e.g., an SoC type architecture). A computing system may generally include a controller, control circuitry, and memory devices on one or more logic boards. By contrast, an SoC (system on a chip), or other embedded system, may include a controller, control circuitry, and memory devices on a single chip.

Figure 1B:
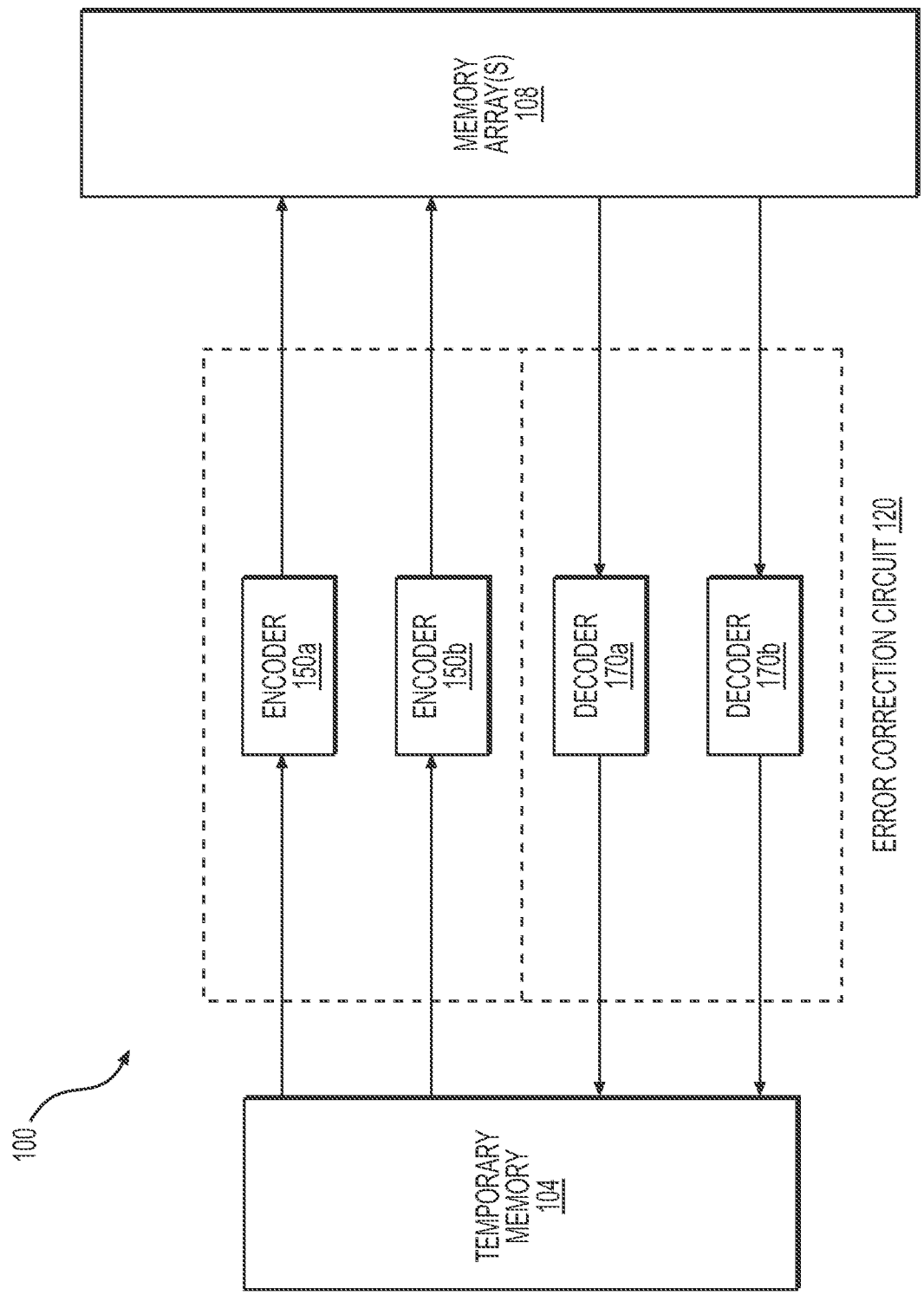
FIG. 1B depicts a block diagram of select components of an error correction circuit having one or more encoders and one or more decoders, according to one aspect of the present disclosure.

With reference now to FIG. 1B, there is depicted an example block diagram of select components of an error correction circuit 120. Error correction circuit may be used in conjunction with one or more memory arrays 108a-108n. To maintain data integrity, some aspects of memory device 100 may include circuitry to implement one or more error correction code (ECC) techniques to detect, and in some cases, correct errors detected in data read from memory. Data bits stored in temporary memory 104, for example, may be encoded by error correction circuit 120 prior to storage in the one or more memory array(s) 108a-108n. In one embodiment, error correction circuit 120 may include one or more encoders 150a-150b, each of which may be configured to encode 128 bits of data. Each of the multiple encoders 150a-150b for example, may perform two bit error correction on the corresponding 128 bits of data, thereby generating 16-bit error encryption codes, that may be appended onto the 128 bits of data. Thus, the output of each encoder may be 144 bits wide. The error correction circuit 120 also may include one or more decoders 170a-170b, each of which may be configured to decode the encoded bits.

While the current example illustrates the memory device 100 storing data bits in the memory array(s) 108a-108n, the memory device 100 may also read data bits from the memory array(s) 108a-108n when accessed by, e.g., controller 114. In this instance, the data bits may be processed by error correction circuit 120 prior to being stored in temporary memory 104.

In one embodiment, circuitry to perform ECC techniques may be included within memory device 100. For example, ECC circuitry may be associated with one or more of non-volatile memory arrays 108a-108n and disposed within control circuitry 115. Additionally, or alternatively, ECC circuitry may be operably coupled to memory device 100. For example, ECC circuitry external to memory device 100 may be employed and, in one embodiment, associated with controller 114. Thus, ECC circuitry may be provided at (i) the memory device level, (ii) the system level and/or (iii) the system level and memory device level.

ECC scrubbing processes generally scan through memory to check for and correct any errors encountered during an ECC scan. In some embodiments, the ECC scrubbing process may sequentially read each memory location, check the data for errors, and re-write corrected data to the same location, if an error is detected in the read data. In other embodiments, the ECC scrubbing process may employ any other suitable read scheme, such as, e.g., random read or selective read to read each memory location and check the data for errors.

As will be described in greater detail below, aspects of the present disclosure may be used as an alternative to, in addition to, or in conjunction with conventionally known ECC techniques to monitor and manage the health of memory devices.

Figure 2:
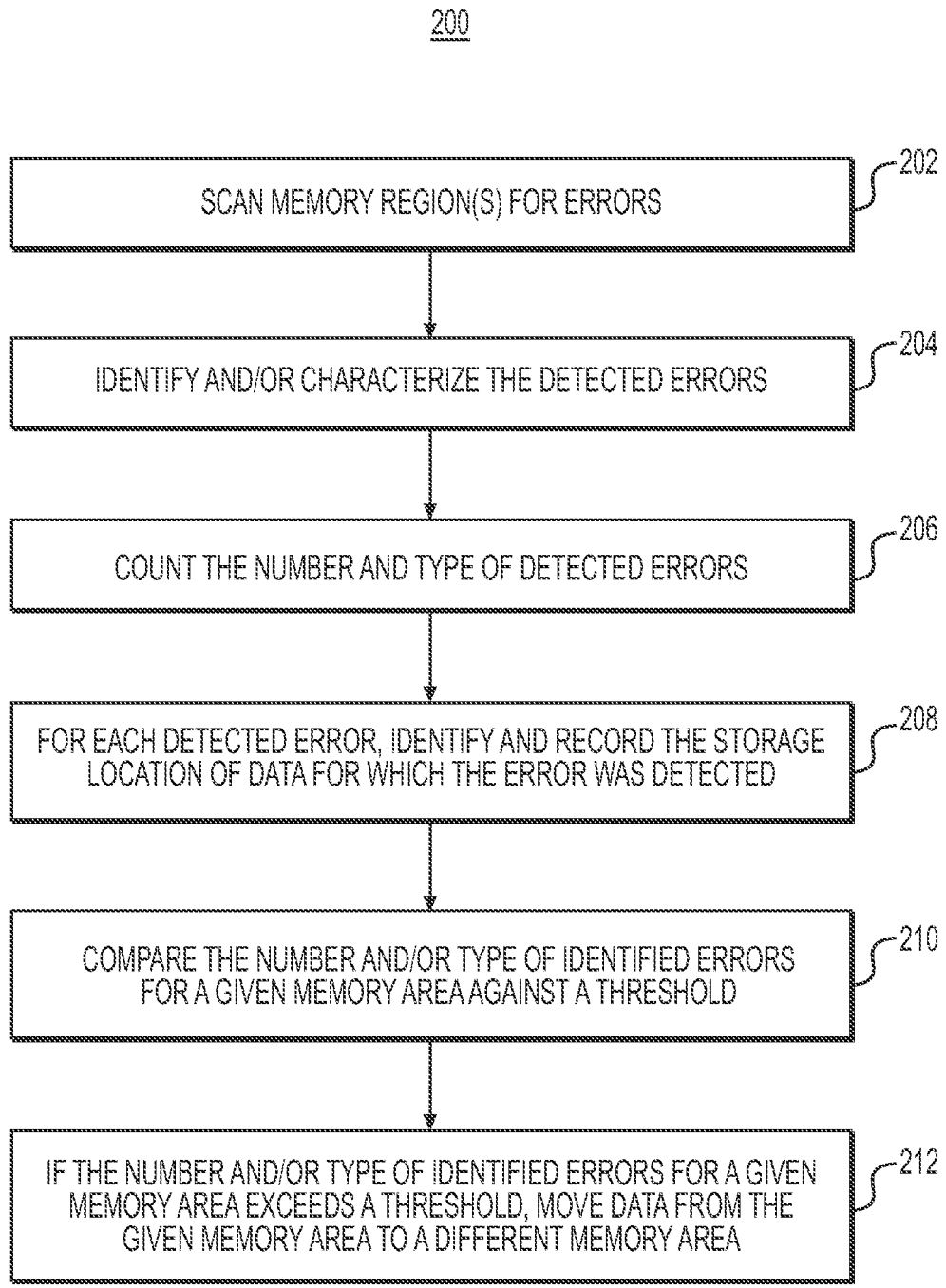
FIG. 2 depicts a flowchart of steps of one example of a health monitoring and management process for a memory device, according to another aspect of the present disclosure.

With reference now to FIG. 2, there is depicted a method 200 for monitoring one or more memory arrays (e.g., non-volatile memory arrays 108a-108n) to dynamically monitor/manage the health and/or extend or otherwise prolong the lifespan of the memory arrays. As explained in further detail below, method 200 may include, but is not limited to, counting the number of errors (e.g., bit errors) in a region or portion of the memory array 108 (e.g., one or more pages of the array) and based on that count adjust the operation of the array. For example, in one embodiment, the circuitry may compare the number of errors against a threshold. The threshold may be predefined, for example, by a user/operator or external circuitry; or the threshold may change dynamically over time based on one or more parameters, such as temperature, usage, age, environment, type of access, etc. When the number of errors meets or exceeds the threshold, controller 114 and/or control circuitry 115 may not employ that region or portion of the memory 108. Instead, controller 114 and/or control circuitry 115 may, for example, map the address corresponding to that region or portion of the memory to another "healthy" portion (e.g., a spare array or page), and thereby not read/write to or employ that "unhealthy" region or portion. Method 200 is illustrated as a collection of blocks in a logical flow diagram, which represents a sequence of operations, some or all of which may be implemented in hardware, software, or a combination thereof. In the context of software, the blocks represent computer-executable instructions stored on one or more computer-readable media that, when executed by one or more processors, perform the recited operations. Generally, computer-executable instructions include routines, programs, objects, components, data structures and the like that perform particular functions or implement particular abstract data types.

The order in which the operations are described should not be construed as a limitation. Any number of the described blocks can be combined in any order and/or in parallel to implement the process, or alternative processes, and not all of the blocks need be executed. For discussion purposes, the processes herein are described with reference to the frameworks, architectures, and environments described in the examples herein, although the processes may be implemented in a wide variety of other frameworks, architectures, or environments.

Method 200 may include scanning one or more memory regions for errors (step 202). For example, one or more memory arrays 108*a*-108*n* may be scanned for bit errors associated with corrupted or otherwise compromised data. In some embodiments, the memory arrays may be scanned by a sniffer. As those of ordinary skill in the art will readily recognize, a sniffer may be a routine (e.g., a diagnostic algorithm) configured to continually test a computer's memory during operation. In some embodiments, a sniffer may sequentially (or randomly, selectively, or according to any other suitable read scheme) read through the memory regions in search of errors, such as, e.g., bit errors. In step 204, the detected errors may be identified and/or characterized by type. For example, the detected errors may be identified as a single bit error, a double bit error, or an uncorrectable error (e.g., a triple bit error).

With reference now to step 206, the number of errors detected and/or the type of each error detected may be counted by any suitable circuitry and/or technique. For example, a Transmit Error Counter (TEC) or a Receive Error Counter (REC) 116 (FIG. 1A) may be employed to count the number and types of errors (e.g., single bit error, double bit error, or triple bit error) identified in relation to data read from one or more of memory arrays 108*a*-108*n*. More particularly, the number and type of the detected bit errors may be counted by incrementing a suitable bit counter. For example, a first bit counter may be incremented for each identified single bit error, and a second bit counter may be incremented for each identified double bit error. Additionally, a third bit counter may be incremented for each identified triple bit or otherwise uncorrectable error. In other embodiments, a single bit counter may be incremented for each identified bit error, regardless of bit error type (e.g., single bit error, double bit error, triple bit error or an otherwise uncorrectable error). The number and type of detected bit errors may be stored in any suitable location, including, but not limited to, a reserved area of memory device 100.

In some instances, the counters used to count the number and/or types of detected errors may become saturated by the volume of detected errors. In such instances, a saturated counter may be rendered inoperable and thus unable to count past the saturation point. In one embodiment, the present disclosure contemplates decrementing the counters when it is not necessary to count errors for a given memory area, such as, e.g., during shutdown or during inactive periods.

Whenever a bit error is detected or otherwise identified, method 200 may further include a step of recording or otherwise tracking the storage location of the data for which the bit error was detected (step 208). The addressable location also may be recorded in any suitable location, such as, e.g., the reserved area of memory.

Turning now to step 210, the number of identified errors may be compared against a threshold. The threshold may be set to limit the maximum number of errors allowed to accrue before one or more steps are implemented to manage and/or prolong the health of the memory devices. The threshold may be the same or different for each of the differing bit error types (e.g., single bit error, double bit error, or triple bit error or an otherwise uncorrectable error). In some embodiments, the threshold may be set to a relatively higher threshold value for correctable errors (e.g., single bit errors or double bit errors). Even though single bit and double bit errors may be corrected by, e.g., an ECC technique, a relatively high or increasing rate of single and/or double bit errors for a given area of memory may signal an impending failure or otherwise cause concern or require intervention. For example, controller 114 and/or control circuitry 115 may, for example, map the address corresponding to that region or portion of the memory to another "healthy" portion (e.g., a spare array or page), and thereby not read/write to or employ that "unhealthy" region or portion. In another example, read and/or write processes may be limited for memory areas signaling impending failure. In other embodiments, the threshold for triple bit or uncorrectable errors may be set to a relatively lower threshold value to, e.g., minimize the impact to system operations which rely on that data to be correct. Stated differently, the threshold for the maximum number of allowable single and/or double bit errors may be relatively higher than the threshold for the maximum number of allowable triple bit errors.

If the result of the comparison performed in step 210 indicates that the number of identified errors for one or more error types does not exceed a threshold(s) set for any of memory arrays 108*a*-108*n*, it may be concluded that those memory array(s) are unaffected/uncompromised or otherwise operating within expectations. For the sake of convenience, memory arrays that are unaffected or otherwise operating within expectations may be referred to herein as "healthy" memory arrays. For "healthy" memory arrays, reading and writing of data may proceed as usual.

If, however, the number of identified errors for one or more error types exceeds a threshold(s) for any of memory arrays 108*a*-108*n*, it may be concluded that those memory arrays may have failed or may be exhibiting symptoms indicative of approaching failure. For the sake of convenience, failed memory arrays or those memory arrays exhibiting symptoms indicative of approaching failure may be referred to collectively herein as "unhealthy" memory arrays. For "unhealthy" memory arrays, one or more actions may be implemented to dynamically manage the health and prolong or otherwise extend the life of the "unhealthy" memory arrays, as explained in further detail below.

With reference to step 212, one example of an action for managing the health of an "unhealthy" memory device may include moving data stored in an "unhealthy" memory array to an otherwise "healthy" memory array. In one example, data stored in an "unhealthy" memory area may be moved to a "healthy" memory array, and the "unhealthy" memory area may be removed (for example, electronically via address mapping/re-mapping) from further use. In another example, the "unhealthy" memory area may not be removed from further use, but instead may be used to store data accessed relatively less often than the data originally stored in the "unhealthy" memory area.

When moving data from a given "unhealthy" memory area to a "healthy" memory area, the bit counter used to count the number and/or type of errors detected for the given "unhealthy" memory area may be reset prior to continuing to count errors in the given "unhealthy" memory area. In other embodiments, the bit counter instead may perform any suitable operation such as, e.g., continuing to increment from the last value without performing a reset operation.

Figure 3:
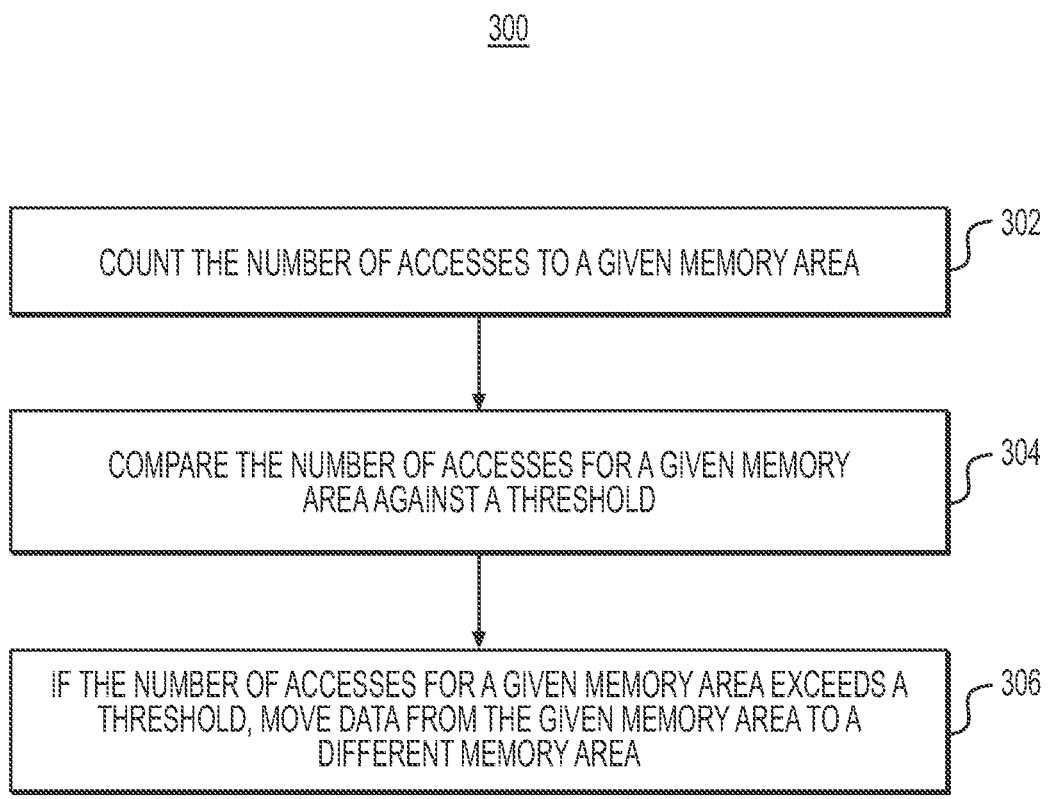
FIG. 3 depicts a flowchart of steps of another example of a health monitoring and management process for a memory device, according to another aspect of the present disclosure.

Turning now to FIG. 3, there is depicted another embodiment of a method for monitoring one or more memory arrays (e.g., non-volatile memory arrays 108a-108n) to dynamically monitor/manage the health and/or extend or otherwise prolong the lifespan of the memory arrays. Method 300 may include one or more aspects of method 200 described above and/or method 400 described below. More particularly, method 300 may include monitoring the number of accesses (e.g., read, write, or erase processes) performed on a given memory region, as explained in greater detail below. Method 300 is illustrated as a collection of blocks in a logical flow diagram, which represents a sequence of operations, some or all of which may be implemented in hardware, software, or a combination thereof. In the context of software, the blocks represent computer-executable instructions stored on one or more computer-readable media that, when executed by one or more processors, perform the recited operations. Generally, computer-executable instructions include routines, programs, objects, components, data structures and the like that perform particular functions or implement particular abstract data types.

The order in which the operations are described should not be construed as a limitation. Any number of the described blocks can be combined in any order and/or in parallel to implement the process, or alternative processes, and not all of the blocks need be executed. For discussion purposes, the processes herein are described with reference to the frameworks, architectures and environments described in the examples herein, although the processes may be implemented in a wide variety of other frameworks, architectures, or environments.

Turning now to step 302, method 300 may include counting the number of accesses made to a particular memory area. For the purposes of this discussion, an "access" to a memory region may include any one of or a combination of read, write, and/or erase events. Access to a particular memory area (e.g., a page of memory) may be counted by any suitable technique known in the art. For example, the number of accesses may be counted by incrementing a bit counter with the occurrence of a read, write, or erase event at each addressable bit location. In addition to counting the total number of accesses, aspects of the present disclosure contemplate counting the total number of each type of access, including, but not limited to, read, write, or erase events. In addition, the number and/or type of accesses may be stored in any suitable location, including, but not limited to, a reserved area of memory device 100.

With reference to step 304, the number of identified accesses may be compared against a threshold. Similarly, the threshold may be predefined, for example, by a user/operator or external circuitry; or the threshold may change dynamically over time based on one or more parameters, such as temperature, usage, age, environment, type of access, etc. The threshold may be set to limit the maximum number of accesses that may be allowed to accrue before one or more steps are implemented to manage and/or prolong the health of the memory devices. In one embodiment, the threshold may be set to limit the total number of accesses allowed for a particular memory region, regardless of access type. In other embodiments, the threshold may include multiple thresholds for limiting the maximum number of read, write, and/or erase type of accesses allowed for a particular memory region. The threshold(s) may be the same or a different value for each type of access (e.g., read, write, or erase). In some embodiments, the threshold may be set to a higher threshold value for limiting the number of reads to a bit cell, for example, because read voltage values may be generally lower and may therefore be less deleterious to bit cells over time. Similarly, the threshold may be set to a lower threshold value for limiting the number of writes to a bit cell, for example, because write voltage values are generally higher and may therefore be more deleterious to bit cells over time.

If the result of the comparison performed in step 304 indicates that the number and/or types of accesses do not exceed one or more threshold(s) set for any of memory arrays 108a-108n, it may be concluded that those memory array(s) are "healthy" and data access (e.g., reading, writing, and/or erasing) may proceed as usual.

If, however, the number of counted accesses, either in total or for one or more types of access, exceeds a threshold(s) for any of memory arrays 108a-108n, it may be concluded that those memory arrays are "unhealthy," and one or more actions may be implemented to dynamically manage the health and prolong or otherwise extend the life of the "unhealthy" memory arrays, as explained in further detail below.

With reference to step 306, one example of an action for managing the health of an "unhealthy" memory device may include moving data stored in an "unhealthy" memory array to an otherwise "healthy" memory array (for example, by mapping the address for the "unhealthy" region or portion of the array to a region or portion of the same or different memory array of the memory device). In one example, data stored in an "unhealthy" memory array may be moved to a "healthy" memory array, and the "unhealthy" memory array may be removed from further use. In another example, the "unhealthy" memory array may not be removed from further use, but instead may be used to store data accessed relatively less often than data originally stored in the "unhealthy" memory array.

Figure 4:
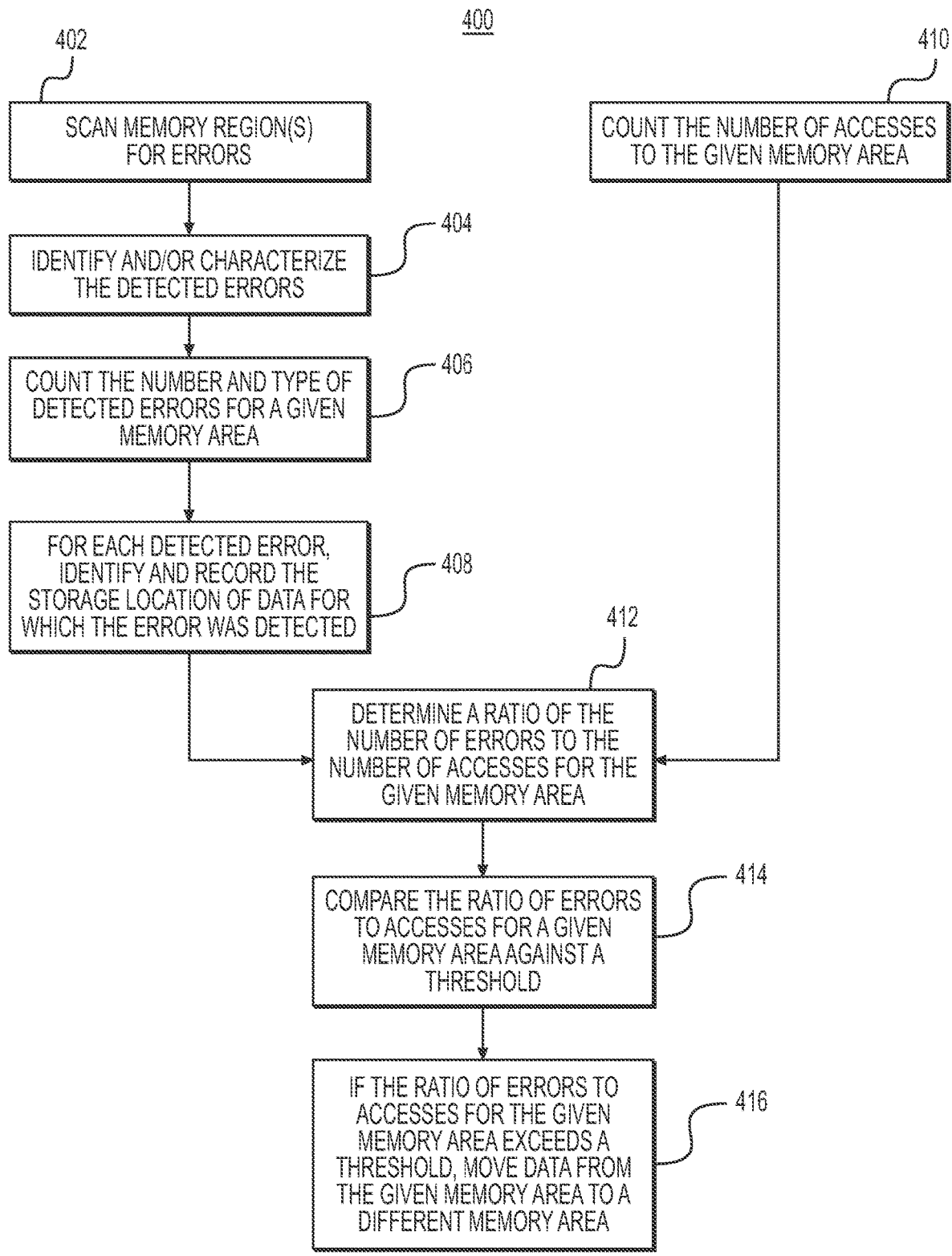
FIG. 4 depicts a flowchart of steps of a further example of a health monitoring and management process for a memory device, according to another aspect of the present disclosure.

With reference now to FIG. 4, there is depicted a method 400 for monitoring one or more memory arrays (e.g., non-volatile memory arrays 108a-108n) to dynamically monitor/manage the health of and/or extend or otherwise prolong the lifespan of the memory arrays. Method 400 may include one or more aspects of methods 200 and 300 described above. In some aspects, method 400 may include monitoring one or more memory areas to, e.g., count the number of errors identified for a particular memory area, count the number of accesses made to the particular memory area, and determine a ratio of the number of errors to number of accesses made to the particular memory area, as described in greater detail below.

Method 400 is illustrated as a collection of blocks in a logical flow diagram, which represents a sequence of operations, some or all of which can be implemented in hardware, software, or a combination thereof. In the context of software, the blocks represent computer-executable instructions stored on one or more computer-readable media that, when executed by one or more processors, perform the recited operations. Generally, computer-executable instructions include routines, programs, objects, components, data structures and the like that perform particular functions or implement particular abstract data types.

The order in which the operations are described should not be construed as a limitation. Any number of the described blocks can be combined in any order and/or in parallel to implement the process, or alternative processes, and not all of the blocks need be executed. For discussion purposes, the processes herein are described with reference to the frameworks, architectures, and environments described in the examples herein, although the processes may be implemented in a wide variety of other frameworks, architectures, or environments.

Turning now to step 402, method 400 may include scanning one or more memory regions for errors, as described above in connection with step 202 of method 200. Method 400 also may include identifying and/or characterizing the detected errors (step 404), as described above in connection with step 204 of method 200. Method 400 may include counting the number of errors detected and/or the type of each error detected (step 406), as described above in connection with step 206 of method 200. Next, method 400 may include recording or otherwise tracking the storage location of the data for which the bit error was detected (step 408), as described above in connection with step 208 of method 200.

Furthermore, method 400 may include counting the number of accesses made to a particular memory area (step 410), as described above in connection with step 302 of method 300. As those of ordinary skill will understand, step 410 of method 400 may also include counting the total number of each type of access, including, but not limited to, read, write, or erase events Next, method 400 may include determining a ratio of the number of errors detected for a given memory area to the number of accesses for the given memory area (step 412). The ratio may be determined by any suitable technique. For example, the ratio may be determined with the following formula:

$$\text{Ratio} = \frac{\text{\# of errors for a given memory area}}{\text{\# of accesses for the given memory area}} \quad (1)$$

Those of ordinary skill in the art will readily recognize that the ratio determined in step 412 may include, but is not limited to, (i) the ratio of the total number of errors detected for a given memory area to the total number of accesses for the given memory area, (ii) the ratio of the total number of errors detected in a given time period for a given memory area to the total number of accesses in the given time period for the given memory area, (iii) the ratio of the total number of one or more particular type(s) of errors (e.g., single, double, or triple bit error) detected in a given memory area to the total number of one or more particular type(s) of accesses (e.g., read, write, or erase) made to the given memory area, (iv) the ratio of the total number of one or more particular type(s) of error (e.g., single, double, or triple bit error) detected for a given time period for a given memory area to the total number of one or more particular type(s) of accesses (e.g., read, write, or erase) made in the given time period to the given memory area, (v) the ratio of the total number of errors detected for a given memory area to the total number of one or more particular type(s) of accesses (e.g., read, write, or erase) made to the given memory area, (vi) the ratio of the total number of errors detected in a given time period for a given memory area to the total number of one or more particular type(s) of accesses (e.g., read, write, or erase) made in the given time period to the given memory area, or (vii) any combination thereof.

With reference now to step 414, the ratio determined in step 412 may be compared to one or more thresholds. Similarly, the threshold may be predefined, for example, by a user/operator or external circuitry; or the threshold may change dynamically over time based on one or more parameters, such as temperature, usage, age, environment, type of access, etc. The one or more threshold(s) may be set to limit the maximum number of errors relative to the number of accesses for a given memory area before it is necessary to implement actions for managing the health of the memory area. For example, a ratio of two errors relative to twenty thousand accesses (2 errors/20,000 accesses) may not necessarily trigger require any action. However, a ratio of two errors relative to twenty accesses (2 errors/20 accesses) may indicate a relatively increased likelihood of failure.

As with methods 200 and 300 above, if the result of the comparison indicates that the determined ratio does not exceed the one or more thresholds, it may be concluded that the scanned memory areas are "healthy" and operation may be continued as usual. If, however, the ratio exceeds the one or more thresholds, it may be concluded that the scanned memory areas are "unhealthy," and one or more action may be implemented to dynamically manage the health and prolong or otherwise extend the life of the "unhealthy" memory areas, as explained above in connection with methods 200 and 300 (step 416).

The methods and techniques described above may be used in conjunction with any other suitable technique for monitoring and/or managing the useful lifespan of memory devices. For example, one or more methods of the present disclosure may be used in conjunction with suitable wear-leveling schemes. More particularly, aspects of the present disclosure may be implemented along with methods that selectively arrange data so that erasures and re-writes are distributed evenly across the memory device. In this way, the overall lifespan of a memory device may be extended by avoiding a high concentration of accesses in a single memory area.

In addition, as alluded to above, the methods and techniques described herein may be used in conjunction with any suitable ECC technique, including, but not limited to, ECC techniques provided within memory device 100 as well as operably coupled to memory device 100.

As explained above, the methods described herein include steps for counting the type and number of errors detected for a given memory area as well as the type and number of accesses to a given memory area. Those of ordinary skill will understand that the errors and accesses may be counted as a function of time. For example, in certain cases, only errors and/or accesses occurring during a selected period of time (e.g., prior 24 hours) may be counted. In addition, the methods described herein contemplate determining the frequency (or rate) at which errors and/or accesses may be occurring for a particular memory area. It is contemplated that the rate at which errors (or a particular type of error) may be occurring may be indicative of a memory area's health.

In some aspects, it is contemplated that the number and/or rate at which errors or accesses may be occurring for a given memory area may be used to extrapolate and/or predict a remaining lifespan for the given memory area as well as neighboring memory areas and other non-neighboring memory areas sharing one or more characteristics (e.g., type of stored data) with the given memory area.

In addition to counting errors and accesses, aspects of the present disclosure also may include monitoring one or more other parameters for a given memory area (e.g., non-volatile memory array 108) or memory device 100. Monitored parameters may include, but are not limited to, temperature, read/write voltage levels, date and time.

The present disclosure is drawn to, among other things, a method of managing a memory device. In some aspects the method includes scanning a first memory region for bit errors; in response to detecting one or more bit errors in the first memory region, incrementing a counter associated with the first memory region based on the number of bit errors detected; comparing a total number of bit errors against a threshold, wherein the total number of bit errors is identified from the first counter; and if the total number of bit errors exceeds the threshold, restricting access to the first memory region by mapping an address corresponding to the first memory region to a second memory region.

In various aspects, the described method(s) may include one or more of the following features: the threshold is predefined by a user; the threshold changes dynamically based on one or more of a temperature of the first memory region and an age of the first memory region; the threshold changes dynamically based on a type of access to the first memory region; the threshold is determined based on an error type of the detected one or more bit errors; the detected one or more bit errors are of a first error type; and the counter is decremented during a shutdown.

In another aspect, the present disclosure is drawn to, among other things, another method of managing a memory device. In some aspects the method includes scanning a first memory region for bit errors; in response to detecting one or more bit errors in the first memory region, determining an error type for each of the detected one or more bit errors, and counting the number of bit errors detected for each error type; setting a threshold for each error type; comparing the number of bit errors detected for each error type against the threshold set for that error type; and if the number of bit errors detected for that error type exceeds the threshold set for that error type, moving data stored in the first memory region to a second memory region.

In various aspects, the described method(s) may include one or more of the following features: the error type includes single bit error, double bit error, or triple bit error; the threshold set for each error type is predefined by a user; the threshold set for each error type dynamically changes based on one or more of a temperature of the first memory region and an age of the first memory region; the threshold set for each error type dynamically changes based on a type of access to the first memory region; and access to the first memory region is limited.

In another aspect, the present disclosure is drawn to, among other things, another method of managing a memory device. In some aspects the method includes, for a first memory region in the memory device, counting a total number of bit errors and a total number of accesses detected for the first memory region; determining a ratio of the total number of bit errors to the total number of accesses detected for the first memory region; comparing the ratio to a threshold; and if the ratio exceeds the threshold, performing a remedial action for the first memory region.

In various aspects, the described method(s) may include one or more of the following features: the threshold is predefined by a user; the threshold dynamically changes based on one or more of a temperature of the first memory region and an age of the first memory region; the threshold dynamically changes based on a type of access to the first memory region; the total number of bit errors and the total number of accesses are counted over a given time period; the bit errors are of an error type; and the accesses are of an access type.

The foregoing description of the inventions has been described for purposes of clarity and understanding. It is not intended to limit the inventions to the precise form disclosed. Various modifications may be possible within the scope and equivalence of the application.

We claim:

1. A method of managing a memory device, comprising:
   scanning a first memory region for bit errors;
   in response to detecting one or more bit errors in the first memory region, incrementing a counter associated with the first memory region based on the number of bit errors detected, wherein the detected one or more bit errors are of a first error type;
   comparing a total number of bit errors against a threshold, wherein the total number of bit errors is identified from the first counter; and
   if the total number of bit errors exceeds the threshold, restricting access to the first memory region by mapping an address corresponding to the first memory region to a second memory region.

2. The method of claim 1, wherein the threshold is predefined by a user.

3. The method of claim 1, wherein the threshold changes dynamically based on one or more of:
   a temperature of the first memory region; and
   an age of the first memory region.

4. The method of claim 1, wherein the threshold changes dynamically based on a type of access to the first memory region.

5. The method of claim 1, wherein the threshold is determined based on an error type of the detected one or more bit errors.

6. The method of claim 1, wherein the counter is decremented during a shutdown.

7. A method of managing a memory device, comprising:
   scanning a first memory region for bit errors;
   in response to detecting one or more bit errors in the first memory region,
      determining an error type for each of the detected one or more bit errors, and
      counting the number of bit errors detected for each error type;
   setting a threshold for each error type;
   comparing the number of bit errors detected for each error type against the threshold set for that error type; and
   if the number of bit errors detected for that error type exceeds the threshold set for that error type, moving data stored in the first memory region to a second memory region.

8. The method of claim 7, wherein the error type includes single bit error, double bit error, or triple bit error.

9. The method of claim 7, wherein the threshold set for each error type is predefined by a user.

10. The method of claim 7, wherein the threshold set for each error type dynamically changes based on one or more of:
    a temperature of the first memory region; and
    an age of the first memory region.

11. The method of claim 7, wherein the threshold set for each error type dynamically changes based on a type of access to the first memory region.

12. The method of claim 7, further comprising limiting access to the first memory region.

13. A method of managing a memory device, comprising:
for a first memory region in the memory device,
counting a total number of bit errors and a total number of accesses detected for the first memory region;
determining a ratio of the total number of bit errors to the total number of accesses detected for the first memory region;
comparing the ratio to a threshold; and
if the ratio exceeds the threshold, performing a remedial action for the first memory region.

14. The method of claim 13, wherein the threshold is predefined by a user.

15. The method of claim 13, wherein the threshold dynamically changes based on one or more of:
a temperature of the first memory region; and
an age of the first memory region.

16. The method of claim 13, wherein the threshold dynamically changes based on a type of access to the first memory region.

17. The method of claim 13, wherein the total number of bit errors and the total number of accesses are counted over a given time period.

18. The method of claim 13, wherein the bit errors are of a single error type.

19. The method of claim 13, wherein the accesses are of a single access type.

* * * * *